United States Patent
Lee et al.

(10) Patent No.: US 8,853,030 B2
(45) Date of Patent: Oct. 7, 2014

(54) METHOD FOR PRODUCTION OF SELECTIVE GROWTH MASKS USING UNDERFILL DISPENSING AND SINTERING

(71) Applicant: Nanocrystal Asia Inc., Taipei (TW)

(72) Inventors: Chong-Ming Lee, Taipei (TW); Andrew Eng-Jia Lee, Taipei (TW)

(73) Assignee: Nanocrystal Asia Inc., Taipei (TW)

( * ) Notice: Subject to any disclaimer, the term of this patent is extended or adjusted under 35 U.S.C. 154(b) by 43 days.

(21) Appl. No.: 13/867,763

(22) Filed: Apr. 22, 2013

(65) Prior Publication Data

US 2013/0280894 A1 Oct. 24, 2013

Related U.S. Application Data

(60) Provisional application No. 61/637,047, filed on Apr. 23, 2012.

(51) Int. Cl.
| | |
|---|---|
| H01L 21/336 | (2006.01) |
| G03F 7/00 | (2006.01) |
| H01L 21/027 | (2006.01) |
| C30B 25/02 | (2006.01) |
| C30B 29/40 | (2006.01) |
| H01L 33/18 | (2010.01) |

(52) U.S. Cl.
CPC ............... *H01L 21/027* (2013.01); *C30B 25/02* (2013.01); *G03F 7/00* (2013.01); *C30B 29/406* (2013.01); *H01L 33/18* (2013.01)
USPC .................................... 438/269; 257/E21.099

(58) Field of Classification Search
CPC ........................................................ H01L 21/027
USPC .............................. 438/44, 269; 257/E21.099
See application file for complete search history.

(56) References Cited

U.S. PATENT DOCUMENTS

| | | | |
|---|---|---|---|
| 2008/0036038 A1* | 2/2008 | Hersee et al. | 257/615 |
| 2008/0210937 A1* | 9/2008 | Kobayashi et al. | 257/51 |
| 2009/0045394 A1* | 2/2009 | Smeeton et al. | 257/13 |
| 2009/0271758 A1* | 10/2009 | Wells | 716/19 |

* cited by examiner

*Primary Examiner* — Daniel Luke
(74) *Attorney, Agent, or Firm* — Juan Carlos A. Marquez; Bacon & Thomas PLLC

(57) ABSTRACT

The present invention discloses a method for production of selective growth masks using underfill dispensing and sintering. The method includes steps of: providing a sapphire substrate, growing a gallium nitride base layer on the sapphire substrate, coating a photoresist layer, performing imprint lithography, exposure and development, performing underfill dispensing, and performing sintering. The production method of the present invention can be applied in the atmosphere, and vacuum chambers as known production approaches are unnecessary. The selective growth masks produced by the method of the present invention make the growth of nanowires cylindrical and perpendicular to the gallium nitride base layer, and each nanowire is parallel to one another.

8 Claims, 9 Drawing Sheets

METHOD FOR PRODUCTION OF SELECTIVE GROWTH MASKS USING UNDERFILL DISPENSING AND SINTERING

BACKGROUND OF THE INVENTION

1. Technical Field

The present invention relates to a method for production of selective growth masks. More particularly, the present invention relates to a method for production of selective growth masks using underfill dispensing and sintering.

2. Description of Related Art

Regarding the technology pertaining to the manufacturing of gallium nitride (GaN) nanowires, the result of the growth of nanowires decides the result of the subsequent epitaxy process. If the nanowires grown are arcuate or sinusoidal, a flat surface required for the thin-film growth of the subsequent epitaxy process is unlikely to form during the epitaxy lateral overgrowth step, and in consequence the thin-film subsequently grown is likely to crack and be susceptible to lattice dislocation thereby to reduce internal quantum efficiency, reduce the probability of combination of electrons and electron holes, and thus reduce light output efficiency.

If the nanowires grow perpendicularly to the gallium nitride base layer and are parallel to each other, the likelihood that an uneven surface forms during the epitaxy lateral overgrowth step will decrease, thereby increasing internal quantum efficiency. Accordingly, it is imperative to provide a method for production of selective growth masks which precisely control the growth of the nanowires, such that the nanowires grow perpendicularly to the gallium nitride base layer and are parallel to each other. With the selective growth masks being able to control the growth of the nanowires, each process produces its unique selective growth mask that brings about its unique type of nanowires.

Conventional nanowire growing processes usually form an effective selective growth of nanowires by an underfill dispensing method. However, the known conventional underfill dispensing methods are mostly done in vacuum environments. The aforementioned underfill dispensing methods are Sputtering, Chemical Vapor Deposition (CVD), Thermal Evaporation, or Atomic Layer Deposition (ALD). They all, at the same time, suffer from expensive equipments required, costing massive manufacturing time, or high manufacturing cost.

BRIEF SUMMARY OF THE INVENTION

The present invention discloses a method for production of selective growth masks using underfill dispensing and sintering. The method includes steps of: providing a sapphire substrate, growing a gallium nitride base layer on the sapphire substrate, coating a photoresist layer, performing imprint lithography, exposure and development, performing underfill dispensing, and performing sintering. The production method of the present invention can be applied in the atmosphere, and vacuum chambers as known conventional production approaches are unnecessary. The selective growth masks produced by the method of the present invention make the growth of nanowires cylindrical and perpendicular to the gallium nitride base layer, and each nanowire is parallel to one another.

To achieve these and other effects, the present invention provides a method for production of selective growth masks using underfill dispensing and sintering, comprising following steps of: providing a sapphire substrate, wherein the sapphire substrate is a base for growing subsequent films; growing a gallium nitride base layer on the sapphire substrate; coating a photoresist layer, wherein the photoresist layer is formed by coating a photoresist material on the gallium nitride base layer formed on the sapphire substrate; performing imprint lithography, exposure and development, wherein the imprint lithography is to imprint a pattern of holes on the photoresist layer; and the exposure and development is to illuminate the imprinted photoresist layer by a light source so as to transfer the pattern of the holes to the photoresist layer and form a protruding dam of the photoresist layer; performing underfill dispensing, wherein an insulating material is filled into a plurality of gaps exposed from the underlying gallium nitride base layer and disposed outside the protruding dam of the photoresist layer; and performing sintering, wherein a heating process is applied to remove the photoresist layer, and the insulating material disposed outside the protruding dam of the photoresist layer forms an insulating layer and acts as a selective growth mask on the gallium nitride base layer.

By implementing the present invention, at least the following progressive effects can be achieved:

1. The method of the present invention can be realized under atmosphere circumstances, there is no need to generate vacuum environment.
2. The underfill material can be solidified easily after dispensing and provide full pattern selective growth masks without distortion.
3. The process steps of the method of the present invention cost less than other methods in equipments required.

The features and advantages of the present invention are detailed hereinafter with reference to the preferred embodiments. The detailed description is intended to enable a person skilled in the art to gain insight into the technical contents disclosed herein and implement the present invention accordingly. In particular, a person skilled in the art can easily understand the objects and advantages of the present invention by referring to the disclosure of the specification, the claims, and the accompanying drawings.

DETAILED DESCRIPTION OF THE INVENTION

Figure 1:
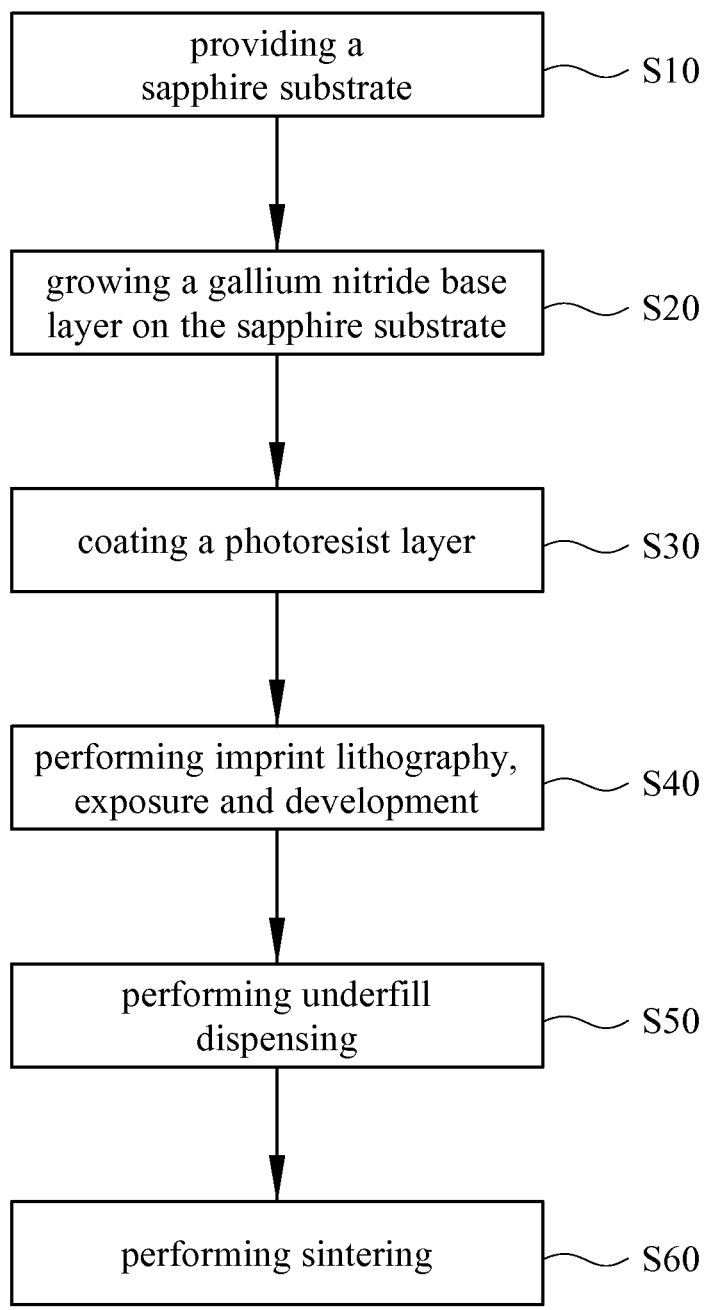
FIG. 1 is a flow chart of a method for production of selective growth masks using underfill dispensing and sintering according to an embodiment of the present invention.

Referring to FIG. 1, in an embodiment of the present invention, a method (S100) for production of selective growth masks using underfill dispensing and sintering comprises the steps of: providing a sapphire substrate (step S10); growing a gallium nitride base layer on the sapphire substrate (step S20); coating a photoresist layer (step S30); performing imprint lithography, exposure and development (step S40); performing underfill dispensing (step S50); and performing sintering (step S60).

In the step of providing a sapphire substrate (step S10) is now described with reference to FIG. 2. The sapphire substrate 10 is for use as a base for subsequent film growths. In a selective growth mask process, the substrate thus used can be made of silicon (Si), silicon carbide (SiC), sapphire, or any material readily conceivable by persons skilled in the art, wherein the silicon can be silicon wafer (111) or silicon wafer (110). In this embodiment, the substrate 10 is made of sapphire.

Figure 2A:
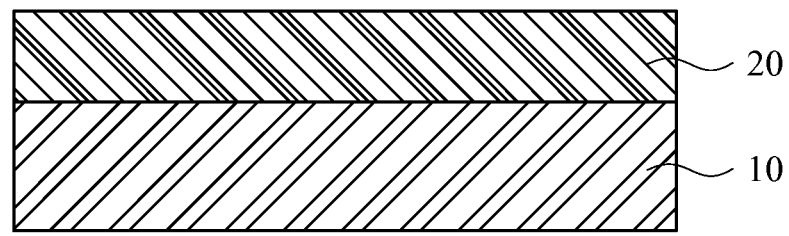
FIG. 2A is a cross-sectional view of the result of a step of growing a gallium nitride base layer according to an embodiment of the present invention.
Figure 2B:
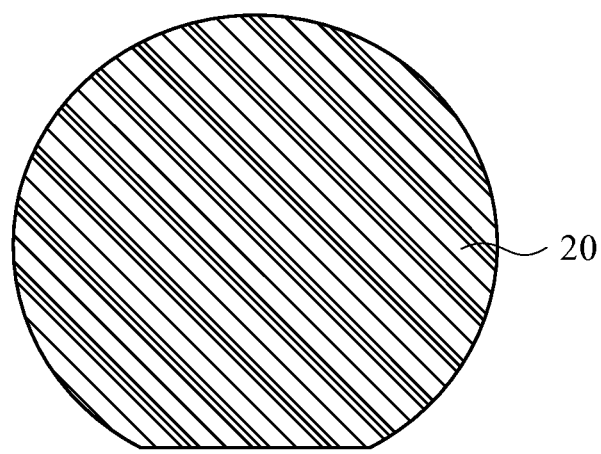
FIG. 2B is a top view of the result of a step of growing the gallium nitride base layer according to an embodiment of the present invention.

Referring to FIG. 2A and FIG. 2B, the step of growing a gallium nitride base layer (step S20) entails growing a gallium nitride base layer 20 on the sapphire substrate 10 to function as the raw material for use in growing subsequent nanowires. For an example, the gallium nitride base layer 20 is grown on the sapphire substrate 10 by metal-organic chemical vapor deposition (MOCVD). In general, the base layer is made of a semiconductor material, wherein the semiconductor material can be a group III-V compound semiconductor material or a group II-VI compound semiconductor material, such as gallium nitride (GaN), aluminum nitride (AlN), indium nitride (InN), indium gallium nitride (InGaN), aluminum gallium nitride (AlGaN), and aluminum indium gallium nitride (AlInGaN). In this embodiment, the base layer is made of gallium nitride (GaN).

Figure 3A:
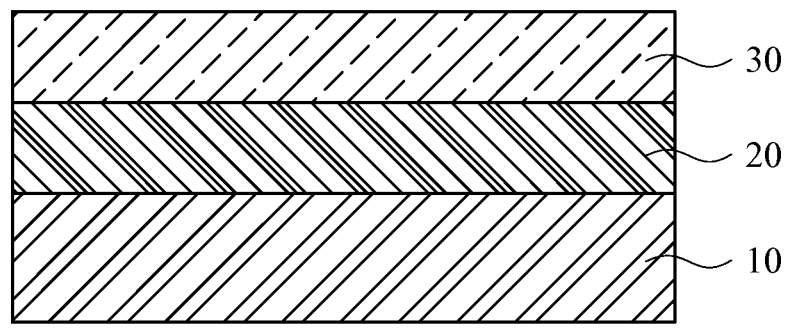
FIG. 3A is a cross-sectional view of the result of a step of coating a photoresist layer according to an embodiment of the present invention.
Figure 3B:
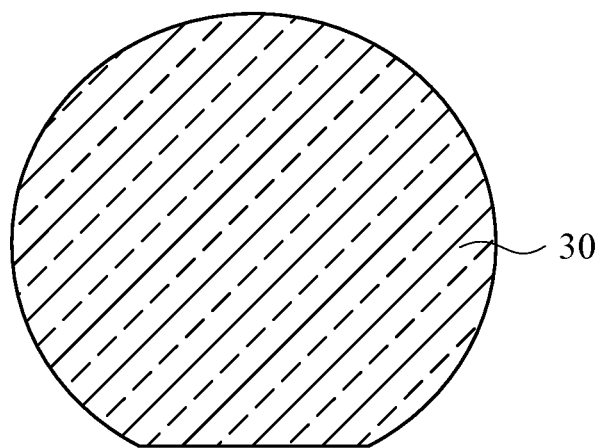
FIG. 3B is a top view of the result of a step of coating the photoresist layer according to an embodiment of the present invention.

Referring to FIG. 3A and FIG. 3B, the step of coating a photoresist layer (step S30) entails coating, by spin coating, a photoresist material on the gallium nitride base layer 20 formed on the sapphire substrate 10 to form a photoresist layer 30 (also known as PR layer), and then the photoresist layer 30 undergoes exposure and development to function as a template for use in the subsequent filling of silica sol-gel.

The photoresist layer 30 is used to control the thickness of the underfilled silica sol-gel. The photoresist layer 30 can be 20~2,000 nm thick, and as thick as the silica sol-gel.

The constituents of the photoresist material of the photoresist layer 30 vary with exposure light sources of different wavelength, such as KrF (248 nm), ArF (193 nm), and EUV (13.5 nm). For example, with a light source of 248 nm KrF light source, the material polyhydroxystyrene (p-hydroxystyrene) and its derivatives are used as the main material for the photoresist layer 30. With a light source of 193 nm ArF light source, the photoresist material uses alicyclic epoxy arcylate (ACEA) and its copolymer. With a light source of 13.5 nm EUV light source, the photoresist material usually uses polyester derivatives and molecular glass single-constituent as the main material. In addition to the mentioned main material, the photoresist material usually contains a photoresist agent solvent, a photo-acid generating agent, a cross-linking agent, or any other additives.

Figure 4A:
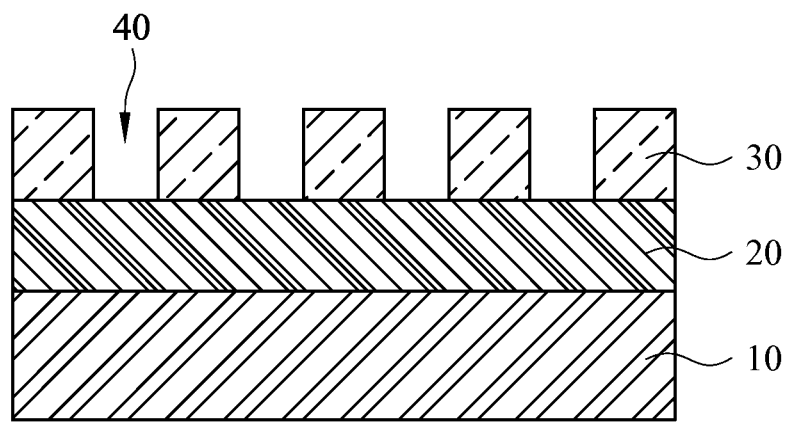
FIG. 4A is a cross-sectional view of the result of a step of performing imprint lithography, exposure and development according to an embodiment of the present invention.
Figure 4B:
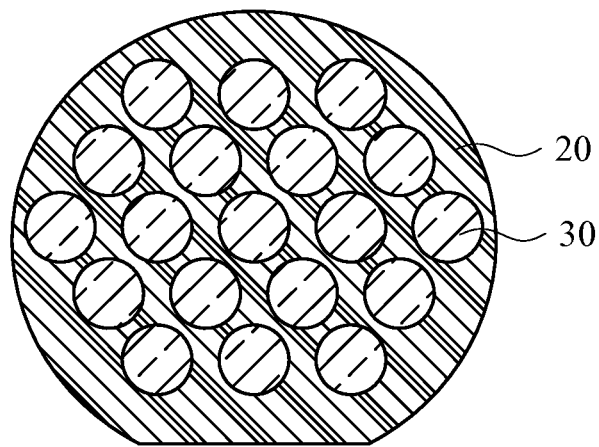
FIG. 4B is a top view of the result of a step of performing imprint lithography, exposure and development according to an embodiment of the present invention.

Referring to FIG. 4A and FIG. 4B, the step of performing imprint lithography, exposure and development (step S40) entails performing imprint lithography on the photoresist layer 30 with a pattern of holes. The imprint lithography is to imprint the pattern of the holes on the photoresist layer 30, and the exposure and development is to illuminate the imprinted photoresist layer 30 by the light source so as to transfer the pattern of the holes to the photoresist layer 30 and form a protruding dam of the photoresist layer 30. To meet different needs, the imprint lithography performed in step S40 is of two types, namely nanoscale imprint lithography and microscale imprint lithography. At this point of time, the layers formed, in sequence, on the sapphire substrate 10 are the gallium nitride base layer 20 and the photoresist layer 30 having a plurality of holes. The photoresist material is usually for use in performing exposure at the UV wavelength or at a shorter wavelength (less than 400 nm). After undergoing UV exposure and development, the photoresist layer 30 having the holes becomes cured thereby to form a protruding dam, wherein the protruding dam has a specific thickness and functions as a template for use in subsequent underfill dispensing. A plurality of gaps 40 formed outside the protruding dam of the photoresist layer 30 can be filled with an insulating material, such as silica.

Upon completion of the imprint lithography (step S40), the pattern of holes of the photoresist layer 30 are uniformly distributed across the gallium nitride base layer 20 and spaced apart from each other by a distance. A portion of the underlying gallium nitride base layer 20 is exposed from the plurality of gaps 40 outside the protruding dam of the photoresist layer 30.

Figure 5A:
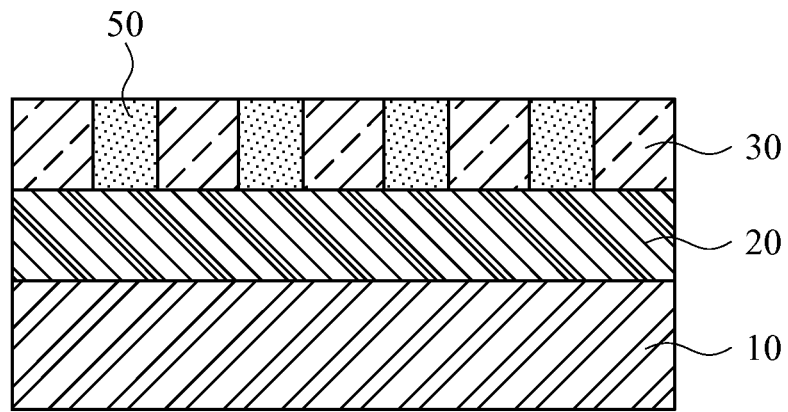
FIG. 5A is a cross-sectional view of the result of a step of performing underfill dispensing according to an embodiment of the present invention.
Figure 5B:
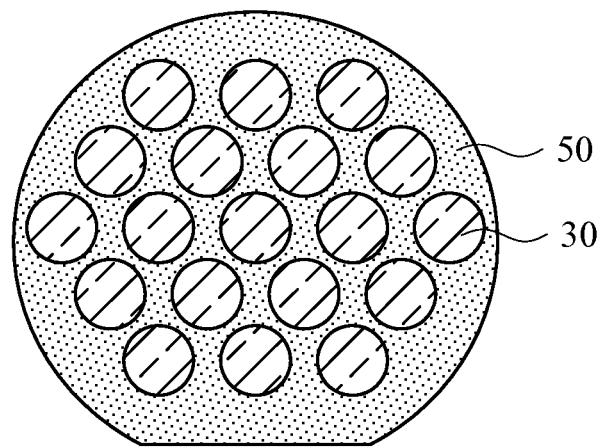
FIG. 5B is a top view of the result of a step of performing underfill dispensing according to an embodiment of the present invention.

Referring to FIG. 4A, FIG. 5A and FIG. 5B, the step of performing underfill dispensing (step S50) entails filling, by spin coating, the insulating material into the plurality of gaps 40 exposed from the underlying gallium nitride base layer 20 and disposed outside the protruding dam of the photoresist layer 30 thereby to form an insulating layer 50 (such as an silicon dioxide layer) with a view to producing a nanowires selective growth mask. The insulating layer 50 can use silica sol-gel as a filling material. Silica sol-gel is a liquid insulating material with a nanoscale hole structure, features excellent fluidity and volatility, and can be evenly filled in the gaps 40 between nanoscale holes (as sol-gel material is gelatinous, with excellent liquidity, and can be easily filled in the hole of nano-scale). The hole-related portion of the gallium nitride base layer 20 is covered with a pattern of holes, wherein the gaps 40 outside the holes are fully filled with silica sol-gel, such as silicon dioxide ($SiO_2$) or silicon nitride ($SiN_x$).

Figure 6A:
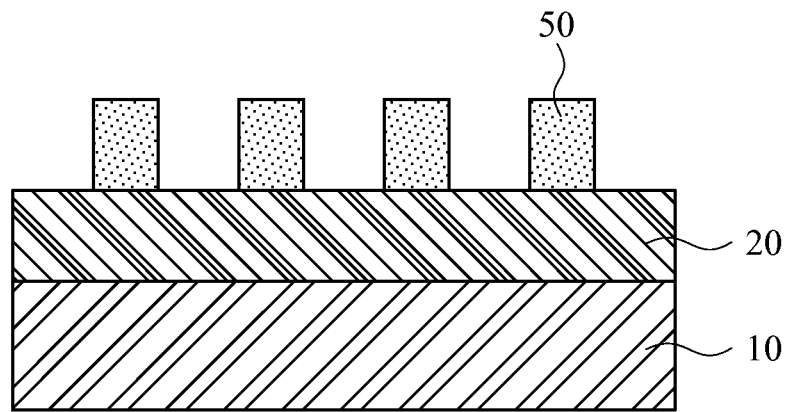
FIG. 6A is a cross-sectional view of the result of a step of performing sintering according to an embodiment of the present invention.
Figure 6B:
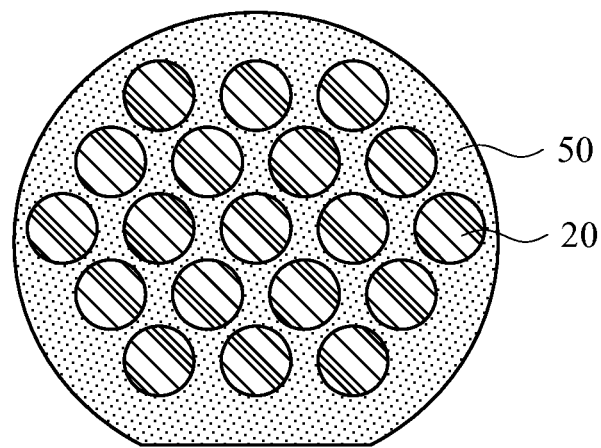
FIG. 6B is a top view of the result of a step of performing sintering according to an embodiment of the present invention.

Referring to FIG. 5A, FIG. 6A and FIG. 6B, the step of performing sintering (step S60) entails performing sintering with a heating process to the photoresist layer 30 covered in the plurality of holes and the insulating layer 50. Sintering with the heating process is using a high temperature (such as between 400° C. and 1,000° C.) oxygen-based heating furnace ($O_2$ furnace) to not only remove the photoresist agent from the plurality of holes of the photoresist layer 30 but also remove the residual solvent in the insulating layer 50, so as to enhance the adhesion of the insulating layer 50 to the surface of the gallium nitride base layer 20. Thus, the insulating layer 50 with the pattern of holes to expose the surface of the gallium nitride base layer 20 from the holes is formed as a selective growth mask on the gallium nitride base layer 20. Wherein, the high temperature $O_2$ furnace also helps the insulating layer 50 become stronger during the sintering process.

At this point of time, the upper surface of the gallium nitride base layer 20 is covered with the selective growth mask formed from the insulating material of the insulating layer 50. The distribution of the selective growth mask of the insulating layer 50 can be adjusted as needed. Holes are formed at a portion of the surface of the gallium nitride base layer 20, wherein the portion of the surface of the gallium nitride base layer 20 is not covered with any pattern formed from the insulating layer 50. Since the holes are not covered with the insulating layer 50, the gallium nitride base layer 20 is exposed from the holes.

Figure 7A:
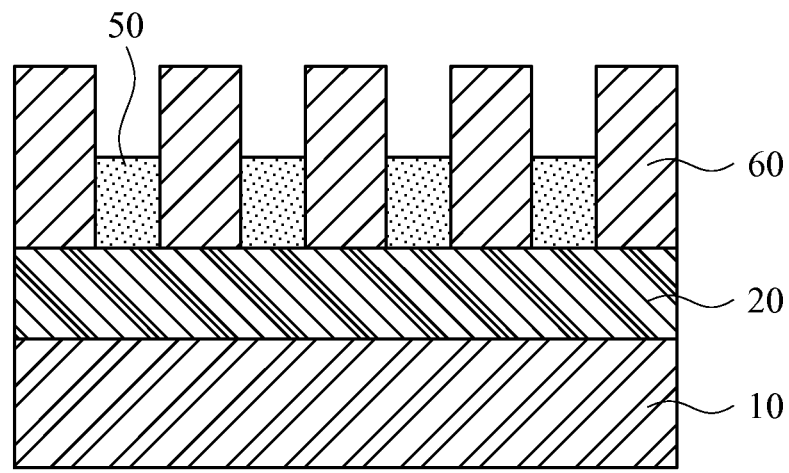
FIG. 7A is a cross-sectional view of the result of growth of nanowires according to an embodiment of the present invention.
Figure 7B:
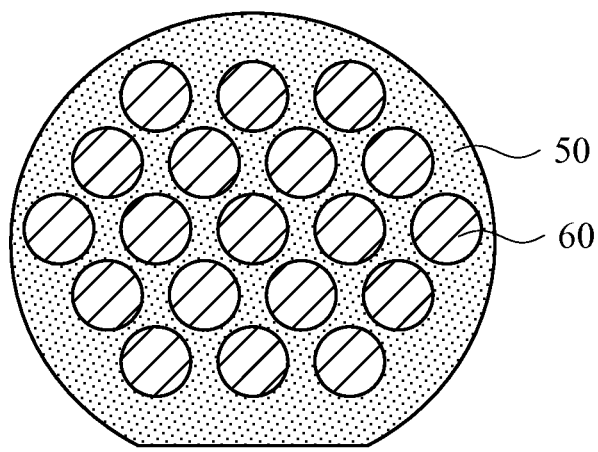
FIG. 7B is a top view of the result of the growth of the nanowires according to an embodiment of the present invention.
Figure 8A:
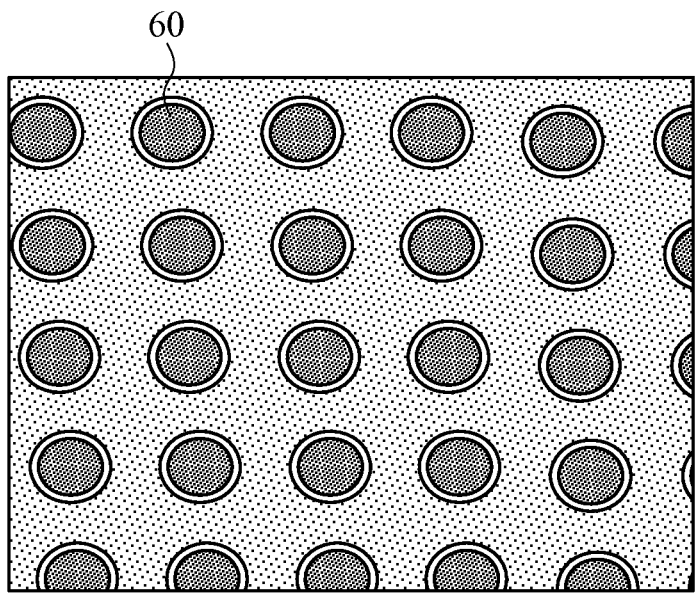
FIG. 8A is a top view of a 4-fold nanowire array according to an embodiment of the present invention.
Figure 8B:
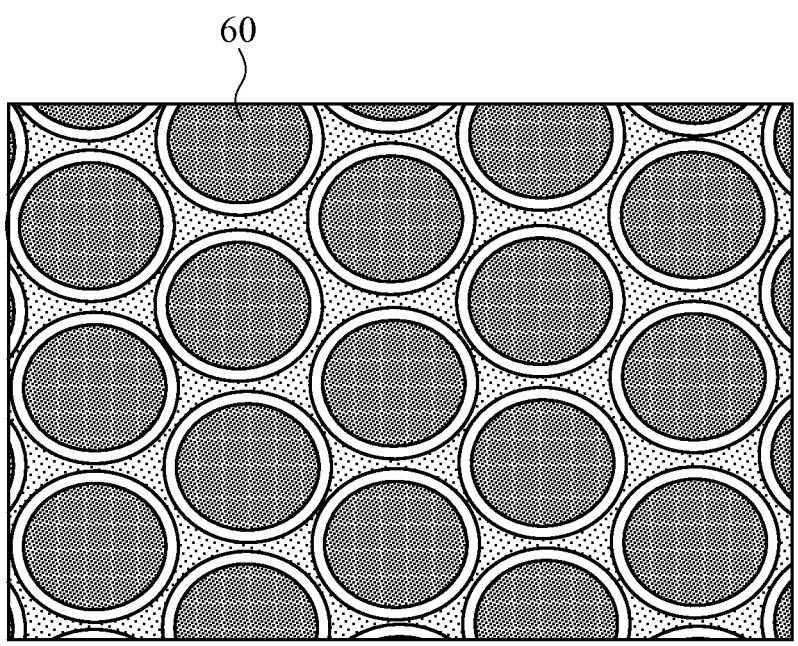
FIG. 8B is a top view of a 6-fold nanowire array according to an embodiment of the present invention.
Figure 8C:
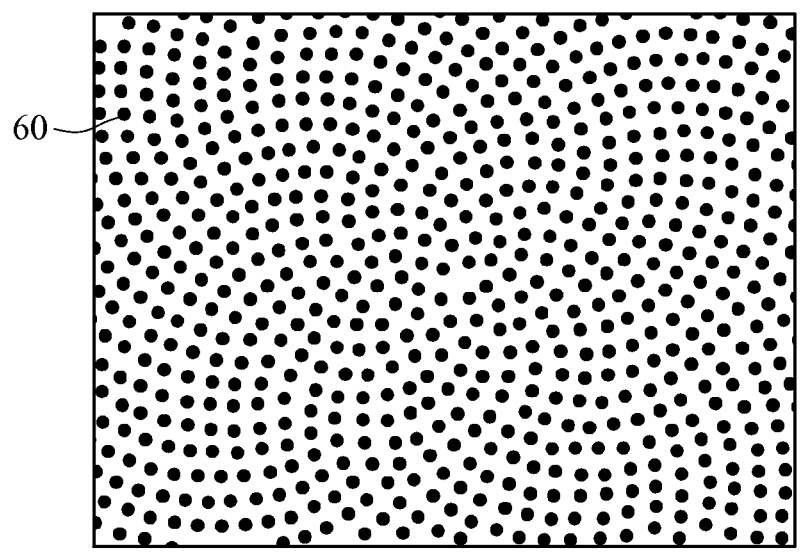
FIG. 8C is a macroscopic top view of the 6-fold nanowire array according to an embodiment of the present invention.
Figure 8D:
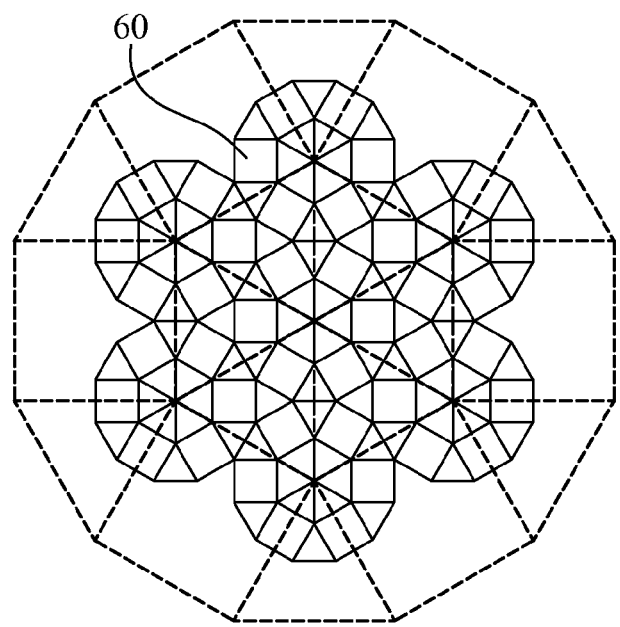
FIG. 8D is a top view of a 12-fold nanowire array according to an embodiment of the present invention.

Referring to FIG. 7A and FIG. 7B, regarding the growing of nanowires 60 in the selective growth mask, since the nanowires 60 cannot be grown on the insulating layer 50, the nanowires 60 can be selectively grown in the holes on the surface of the gallium nitride base layer 20 by a selective growth technology or a pulse growth technology. Since the pattern of the holes formed on the insulating layer 50 has a specific thickness, it provides a lateral supporting force required for the growth of the nanowires 60.

Moreover, since the insulating layer 50 precludes any defect which might otherwise result from the difference in lattice constants between the gallium nitride base layer 20 and the sapphire substrate 10, underlying defects are blocked by the insulating layer 50 and stopped growing upward during the continuous upward growth of the nanowires 60.

As soon as the nanowires 60 grow and reach a specific height, they undergo lateral coalescence thereby to form a semiconductor material with a semiconductor layer of low defect density. The semiconductor material with the low defect density semiconductor layer is applicable to the production of light-emitting components. The gaps between the adjacent nanowires 60 give rise to different reflective indexes along the outgoing light path thereby to greatly reduce total reflection of incident light, increase the scattering angle of the incident light, and thus enhance the light output efficiency of the light emissions.

Referring to FIG. 8A through FIG. 8D, the nanowires 60 are parallel to one another. The nanowires 60 can be of pillar type or of cone type, and the cross-sectional shape of the nanowires 60 can be of square shape, polygon shape, oval shape, or round shape. The dimensions of the nanowires 60 can be 20~6,000 nm in length and 20~2,000 nm in width. The less the width is, the easier the nanowires 60 become cylindrical.

As also shown in FIG. 8A to FIG. 8D, the pitch/spacing of the nanowires 60 can be between 20 nm and 2,000 nm, wherein the pitch/spacing of the nanowires 60 is defined as the distance between the center of two adjacent nanowires 60. The nanowire array formed by the nanowires 60 can be hexagonal or quasi-crystal arrangement (such as 4, 6, 12 fold, wherein fold is defined as a group of nanowires to form a geometry). As for the symmetry of each one of the nanowires 60, one direction of the cross-sectional dimension of one nanowire 60 can be much less than 1,000 nm, and in an orthogonal direction, the dimension can be substantially equal to or greater than 1,000 nm. For example: selecting x-axis=1,000 nm and y-axis<<1,000 nm, which is arranged as, the length (as known as the height of one of the nanowires 60) is 1,000 nm, and the width is far less than 1,000 nm. In one embodiment, a best aspect ratio (length:width) of the nanowires 60 to form a cylinder shape and be mutually parallel is 10:3.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A method for production of selective growth masks using underfill dispensing and sintering, comprising following steps of:

providing a sapphire substrate, wherein the sapphire substrate is a base for growing subsequent films;

growing a gallium nitride base layer on the sapphire substrate;

coating a photoresist layer, wherein the photoresist layer is formed by coating a photoresist material on the gallium nitride base layer formed on the sapphire substrate;

performing imprint lithography, exposure and development, wherein the imprint lithography is to imprint a pattern of holes on the photoresist layer, and the exposure and development is to illuminate the imprinted photoresist layer by a light source so as to transfer the pattern of the holes to the photoresist layer and form a protruding dam of the photoresist layer;

performing underfill dispensing, wherein an insulating material is filled into a plurality of gaps exposed from the underlying gallium nitride base layer and disposed outside the protruding dam of the photoresist layer; and performing sintering, wherein a heating process is applied to remove the photoresist layer, and the insulating material disposed outside the protruding dam of the photoresist layer forms an insulating layer and acts as a selective growth mask on the gallium nitride base layer.

2. The method of claim 1, wherein the gallium nitride base layer is formed by Metal-Organic Chemical Vapor Deposition (MOCVD).

3. The method of claim 1, wherein the thickness of the photoresist layer is between 20 nm and 2,000 nm.

4. The method of claim 1, wherein the imprint lithography is a nanoscale imprint lithography or a microscale imprint lithography.

5. The method of claim 1, wherein the light source is a 248 nm KrF light source, a 193 nm ArF light source, or a 13.5 nm EUV light source.

6. The method of claim 1, wherein the insulating material is silicon dioxide ($SiO_2$) or silicon nitride ($SiN_x$).

7. The method of claim 1, wherein the sintering is performed by using a high temperature oxygen-based heating furnace ($O_2$ furnace).

8. The method of claim 1, wherein plural nanowires are grown in the selective growth mask.

* * * * *